(12) United States Patent
Bardal et al.

(10) Patent No.: US 7,791,436 B2
(45) Date of Patent: Sep. 7, 2010

(54) RADIO FREQUENCY FILTER HAVING COUPLED TRANSMISSION LINES AND AN ACOUSTIC IMPEDANCE ELEMENT

(75) Inventors: Sigmund Bardal, Horten (NO); Stig Rooth, Asker (NO); Stein Hollung, Horton (NO)

(73) Assignee: Norspace AS, Horten (NO)

( * ) Notice: Subject to any disclaimer, the term of this patent is extended or adjusted under 35 U.S.C. 154(b) by 327 days.

(21) Appl. No.: 11/997,188

(22) PCT Filed: Aug. 8, 2006

(86) PCT No.: PCT/NO2006/000293

§ 371 (c)(1),
(2), (4) Date: Jan. 29, 2008

(87) PCT Pub. No.: WO2007/018436

PCT Pub. Date: Feb. 15, 2007

(65) Prior Publication Data

US 2008/0197942 A1    Aug. 21, 2008

(30) Foreign Application Priority Data

Aug. 11, 2005  (NO) .................................. 20053802

(51) Int. Cl.
*H01P 1/203* (2006.01)
*H01P 1/205* (2006.01)
*H03H 9/54* (2006.01)
*H03H 9/64* (2006.01)

(52) U.S. Cl. ........................ 333/204; 333/193; 333/187; 333/203

(58) Field of Classification Search ......... 333/204–205, 333/187, 189, 193, 195, 203
See application file for complete search history.

(56) References Cited

U.S. PATENT DOCUMENTS 5,467,065 A * 11/1995 Turunen et al. ............. 333/132

(Continued)

FOREIGN PATENT DOCUMENTS

GB    2 413 710 A  * 11/2005

(Continued)

OTHER PUBLICATIONS

Derwent Abstract only of patent publication No. TW 508904, published Nov. 1, 2002.*

(Continued)

*Primary Examiner*—Barbara Summons
(74) *Attorney, Agent, or Firm*—Kevin P. Radigan, Esq.; Heslin Rothenberg Farley & Mesiti P.C.

(57) ABSTRACT

A radio filter has a band pass filter for passing a desired band of signal frequencies and a band stop filter for reducing the passing of a band of undesired signal frequencies. The filter comprises an input terminal, an output terminal, and a filter having a multiple of transmission lines arranged between said input and output terminal which filters input signals through said input terminal to pass signals of a given frequency band. A ground is connected to said transmission lines at first ends of said multiple of transmission lines and acoustic impedance elements are connected between said ground layer and second ends of said multiple transmission lines for providing a stop band filter function of the input signals, and whereby the input signal after band pass filtering and stop band filtering is provided at said output terminal.

11 Claims, 6 Drawing Sheets

U.S. PATENT DOCUMENTS

| | | | |
|---|---|---|---|
| 5,808,523 A * | 9/1998 | Kobayashi et al. | 333/193 |
| 6,404,302 B1 * | 6/2002 | Satoh et al. | 333/193 |
| 6,696,901 B1 | 2/2004 | Takeda et al. | |
| 6,696,903 B1 | 2/2004 | Kawahara | |
| 7,084,718 B2 * | 8/2006 | Nakamura et al. | 333/133 |
| 2004/0051601 A1 | 3/2004 | Frank | |

OTHER PUBLICATIONS

Mi-Hyun Son et al., "Low-cost realization of ISM band pass filters using integrated combline structures" Radio and Wireless Conference 2000. RAWCON 2000. 2000 IEEE Sep. 10-13, 2000, Piscataway, NJ, USA, IEEE, Sep. 10, 2000, pp. 261-264.

International Search Report for International Application No. PCT/NO2006/000293, mailed on Feb. 19, 2007.

* cited by examiner

RADIO FREQUENCY FILTER HAVING COUPLED TRANSMISSION LINES AND AN ACOUSTIC IMPEDANCE ELEMENT

FIELD OF THE INVENTION

The present invention relates in general to the field of radio frequency apparatus, in particular to radio frequency filters and in more particular to radio frequency filters employing acoustic wave devices.

DESCRIPTION OF RELATED ART

Conventionally, a combination of inductors (L) and capacitors (C) are used in electronic circuits to achieve a number of functions. Low loss filtering is one of these applications, achieved by LC-filter circuits.

All components in a circuit have physical constraints. Such constraints can be related to size and shape, but could also be related to stability and noise properties.

In radio frequency (RF) communications it is often desirable to pass a band of signal frequencies while blocking other frequencies. Filters built from a chain of capacitors and inductors are well known in the art. Filtering functions, such as low pass, band pass, band stop and high pass are achieved. U.S. Pat. No. 4,963,843 discloses one example of a stripline filter with combline resonators having a number of conductive strips.

Typically, in high frequency communication systems (RF, UHF or VHF) some filters are designed to filter one band of frequencies from all other signal frequencies. In many applications there are also included notch filters or band rejection filters for suppressing signals at certain narrow frequency bands, for example carrier frequency signals or harmonics or mixing products of carrier, local oscillator or intermediate frequency signals in order to avoid undesirable interference in the subsequent processing of the desired band of frequencies.

High quality band pass filters with a notch function is thus desirable, as exemplified by U.S. Pat. No. 6,879,224 B2.

It has been demonstrated that notches in the responses of such filters may be obtained using acoustic resonators in place of capacitors. U.S. Pat. No. 6,879,224 B2 describes an example of an integrated filter and impedance matching network using acoustic resonators. It is explained how acoustic resonators behave similar to a capacitor outside of its resonant frequency and so does not impact the function of the network in which it is being used outside of its resonant frequency. At the resonant frequency, the resonator transitions from capacitor to short circuit to open circuit and back to capacitor.

Thus, the resulting LC-filter is a structure with an additional notch, a notch with the characteristics delivered by a high quality resonator. Due to the high Q-factor of the acoustic resonator, the notch in the frequency response will be sharp and the resonator characteristics may be designed such that the notch is fairly close to the pass band.

Another approach to obtaining notch filters based on Surface Acoustic Wave (SAW) devices have been explained in U.S. Pat. No. 4,126,837.

At very high frequencies the capacitance and inductance values required will be small. At high frequencies it is, however, very difficult to provide inductor elements which gives a highly reproducible inductance value for the mounted element. Even mounting conditions and parameters may influence the inductance, e.g. by resulting in a varying inductive coupling between the inductor element and its surroundings, from device to device.

It is thus an objective of this invention to provide a filter with a combination of band pass characteristics and notch or band rejection characteristics for high frequency applications which gives has good reproducibility in a production process.

It is also an objective of this invention to provide a filter with a combination of band pass characteristics and notch or band rejection characteristics for high frequency applications which minimizes the physical space required for such a device.

SUMMARY OF THE INVENTION

The above objectives are achieved by a radio filter having a band pass filter for passing a desired band of signal frequencies and a stop band filter for reducing the passing of a band of undesired signal frequencies. The filter comprises an input terminal, an output terminal and a filter having a multiple of coupled transmission lines arranged between said input and output terminal, which filters input signals through said input terminal to pass signals of a given frequency band. A ground is connected to said transmission lines at first ends of said multiple of transmission lines and an acoustic impedance element is connected between said ground layer and second ends of said multiple transmission lines for providing a stop band filter function of the input signals, and whereby the input signal after band pass filtering and stop band filtering is provided at said output terminal.

In one embodiment of the radio filter according to the invention the input terminal, the output terminal and the filter are part of a filter layer.

In another embodiment of the radio filter according to the invention the ground is a ground layer.

In a further embodiment of the radio filter according to the invention the filter layer comprises coupled transmission lines in a combline structure In an alternative embodiment of the radio filter according to the invention comprises microstrip lines.

Yet another embodiment of the radio filter according to the invention comprises a surface acoustic wave (SAW) impedance element. The SAW-element is connected between said ground layer and one of said second ends of said multiple transmission lines.

Still yet another embodiment of the radio filter according to the invention comprises a film bulk acoustic resonator (FBAR) element. The FBAR-element is connected between said ground layer and one of said second ends of said multiple transmission lines.

A yet further embodiment of the radio filter according to the invention comprises several physically separated surface acoustic wave (SAW) devices.

Still another embodiment of the radio filter according to the invention comprises a single piezoelectric crystal in which separate regions and separate transducers provide several surface acoustic wave (SAW) devices in a single crystal based integrated component.

Still another embodiment of the radio filter according to the invention comprises multiple transmission lines arranged in a combline structure.

In still yet another embodiment of the radio filter according to the invention the acoustic resonators and the transmission lines are located on a single piezoelectric substrate In the following the radio filter according to the invention will be described in some more detail with references to the appended drawings in which;

BRIEF DESCRIPTION OF THE APPENDED DRAWINGS

Figure 3A:
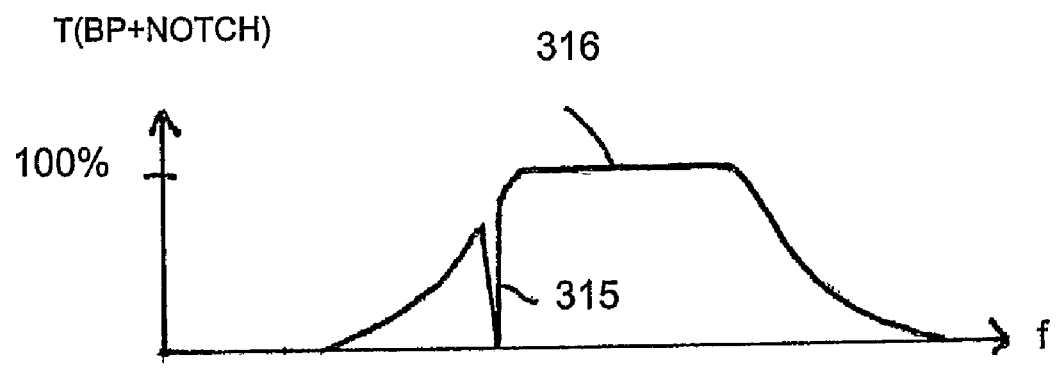
Figure 3B:
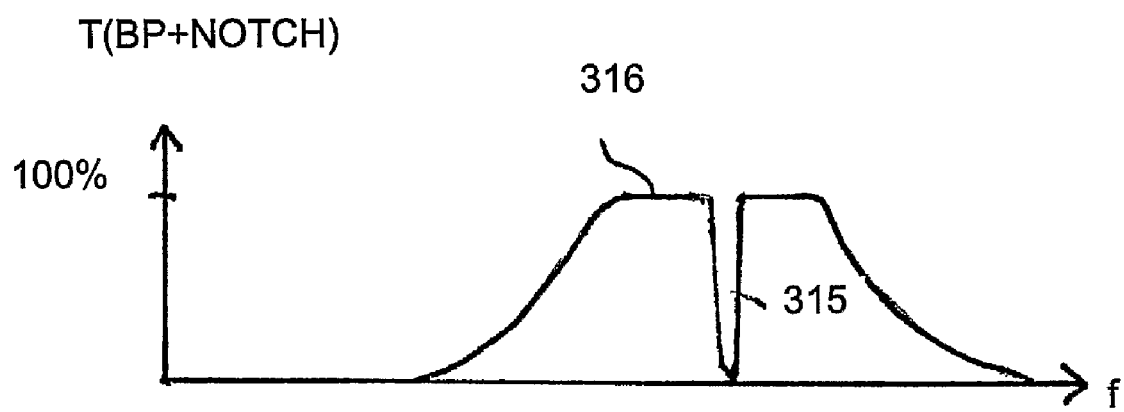

FIG. 3A-B illustrates typical examples of frequency responses obtained with embodiments of a filter according to the invention.

Figure 4:
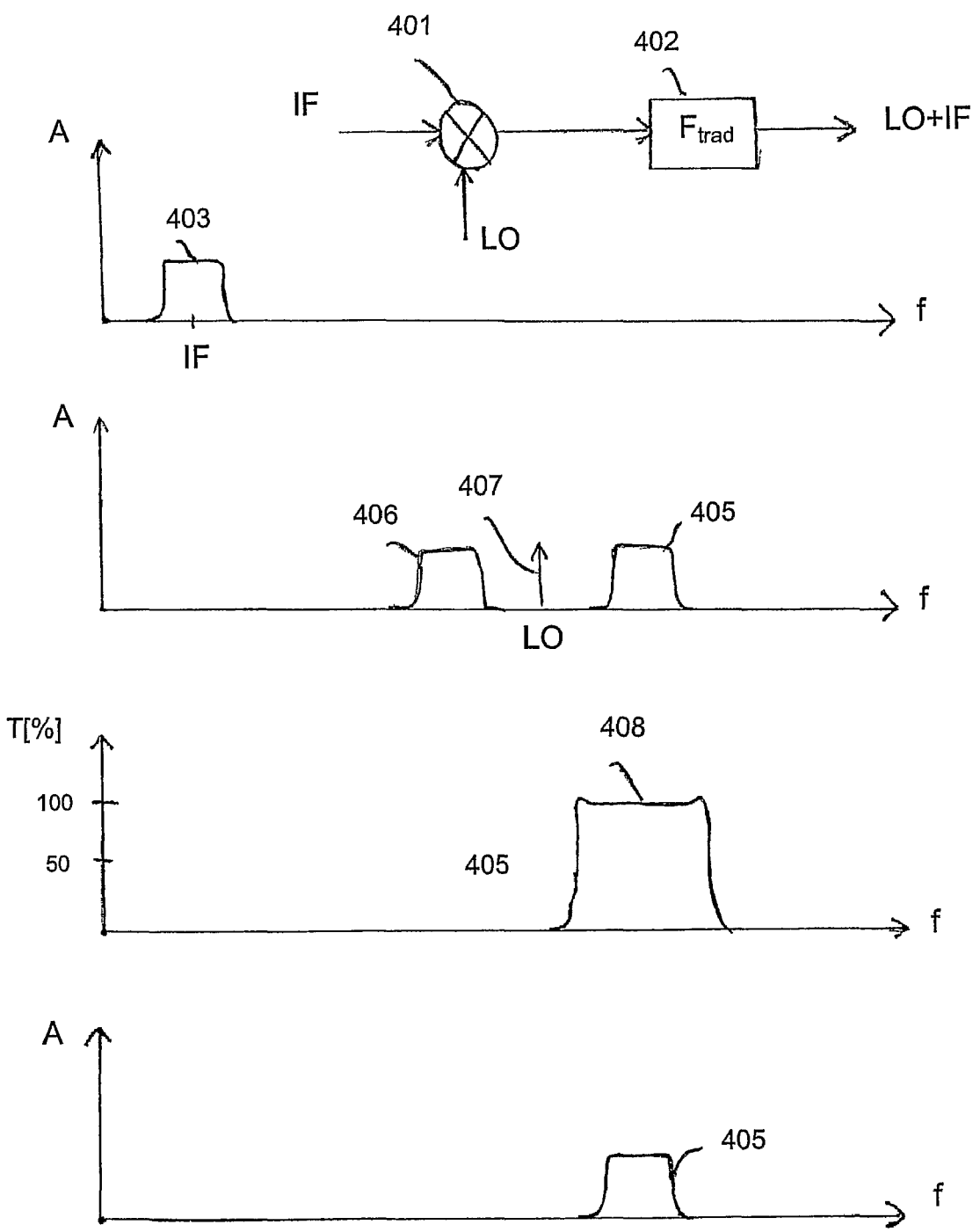

FIG. 4 illustrates a frequency conversion and signal filtering process according to prior art solutions.

Figure 5:
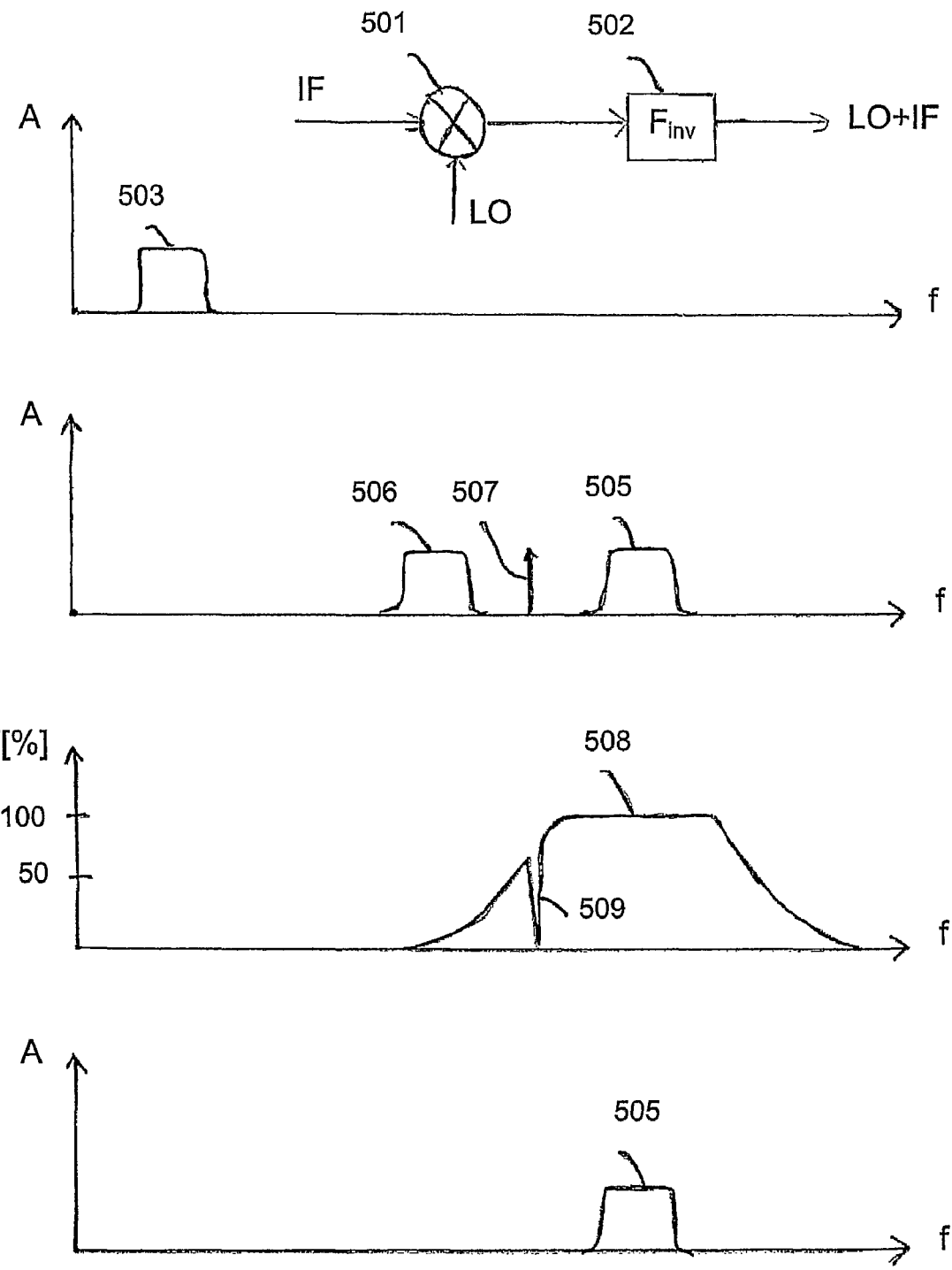

FIG. 5 illustrates a frequency conversion and signal filtering process using a radio filter device according to the invention.

Figure 6:
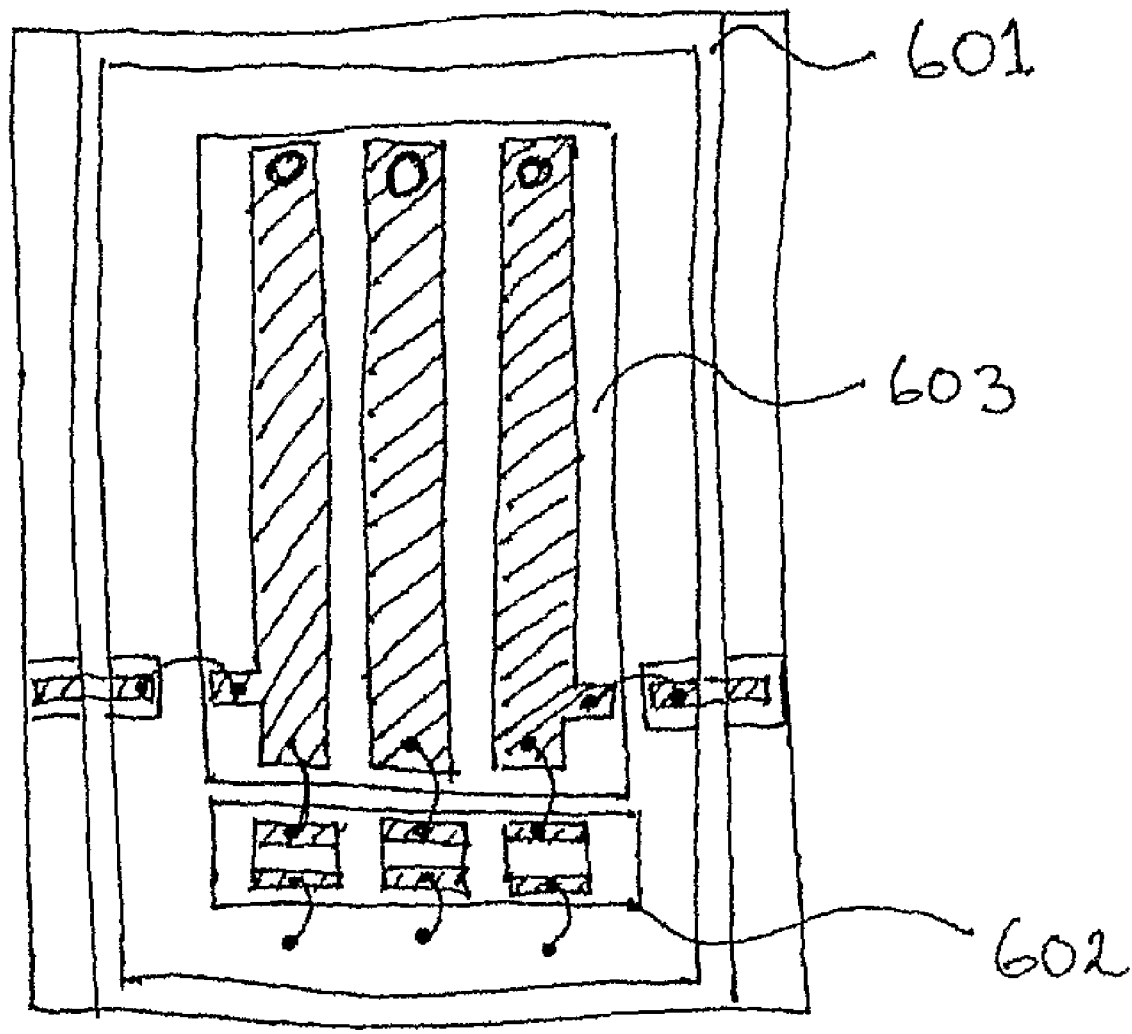

FIG. 6 illustrates a mounting arrangement in a housing where the combline element and the acoustic impedance elements are mounted separately.

DETAILED DESCRIPTION OF PREFERRED EMBODIMENTS

Figure 1:
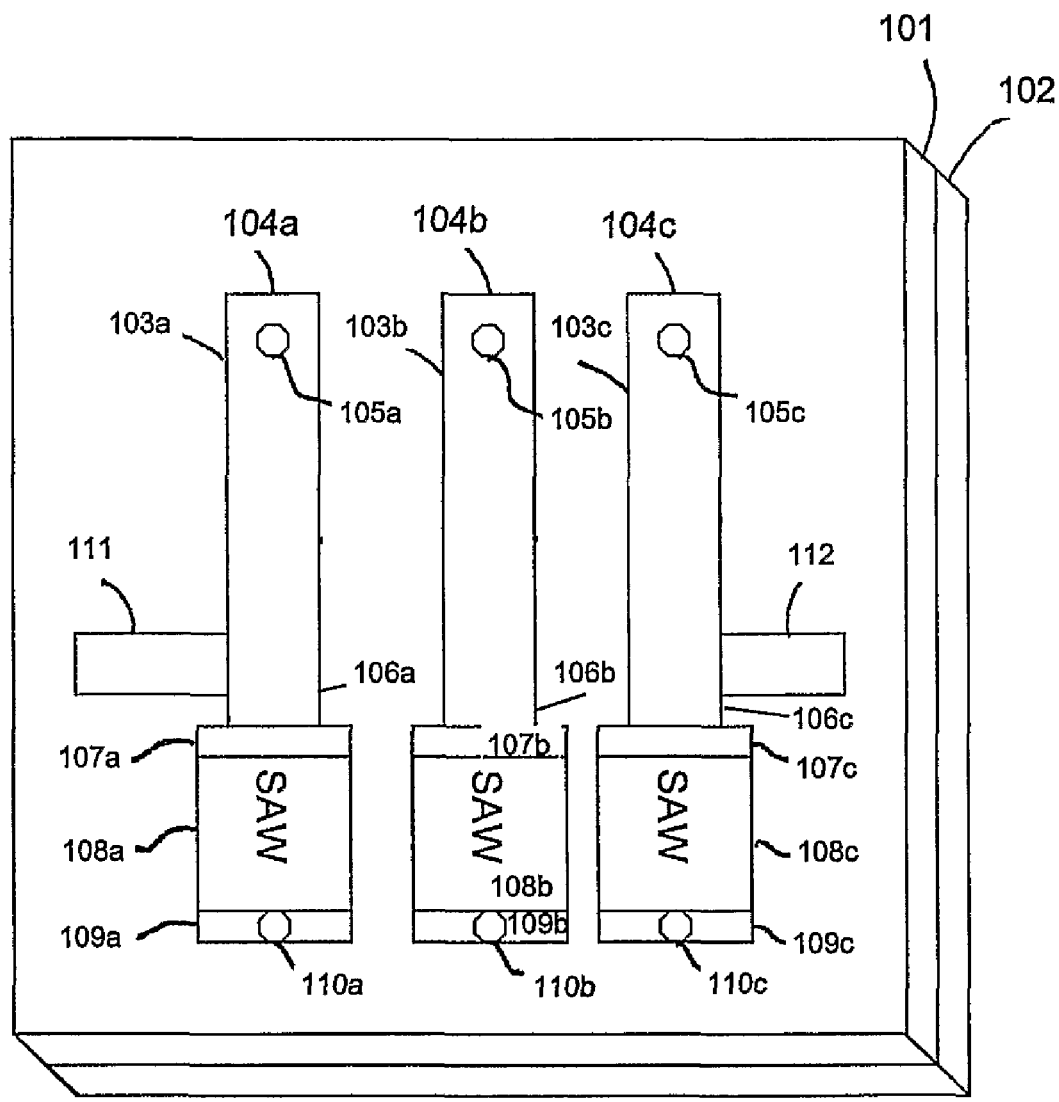
FIG. 1 illustrates one embodiment of the filter according to the invention.

Referring to FIG. 1, one embodiment the filter according to the invention is illustrated comprising a filter layer 101 and a ground layer 102. The filter layer 101 is provided with coupled transmission line structures, in this case three microstrip lines 103a-c. In alternative embodiments of the filter according to the invention the transmission line could in principle be any type of coupled electromagnetic transmission line architecture known to a person skilled in the art, e.g. based on striplines implemented in a suitable substrate or other waveguide structures, such as slablines in an appropriate mechanical construction, otherwise known to a person skilled in the art. Each microstrip line 103a-c is at a first end 104a-c coupled to the ground layer 102, using for example a first set of via-holes 105a-c. Each microstrip line 103a-c is at a second end 106a-c connected to a first terminal 107a-c of an acoustic impedance element 108a-c, for example a resonator element such as a surface acoustic wave (SAW) resonator device or a film bulk acoustic resonator (FBAR) device. The second terminal 109a-c of each acoustic impedance element (e.g. SAW- or FBAR-device) is connected to the ground layer 102, using for example a second set of via-holes 110a-c. The coupled transmission line structure could be based on TEM (Transverse Electro-Magnetic mode) or quasi-TEM waveguides. Bulk waveguides as well as planar waveguides can be used, as long the waveguide structure provides electromagnetic coupling between the resonators of the structure.

In the context of this text, a SAW impedance element should be understood to include devices which utilize acoustic waves localized mainly at or near the surface, such as Rayleigh waves and pseudo surface acoustic waves.

A first microstrip line 103a is connected to an input terminal 111, at which terminal an input signal to be filtered is applied. A second microstrip line 103c is connected to an output terminal 112, at which terminal a filtered version of the signal applied at the input terminal will be available for further processing, for example by additional circuitry external to the filter device described herein.

The microstrip lines can be implemented on a ceramic substrate such as an alumina substrate. Alumina substrates generally have high temperature stability, low outgassing, and low loss properties. Alumina substrates are preferred in a wide range of applications due to the above mentioned properties. Substrates made from other materials, such as fused quartz, crystalline quartz, or aluminum nitride could also be used, if preferable in the application in question. Other typical printed circuit board materials, such as Teflon® based materials, polyimide, Thermount® could also be used.

The microstrip lines are typically produced by sputtering or evaporating a metal layer onto the substrate and etching out the lines using standard photolithographic techniques using a mask, radiation, and etching stages. The microstrip lines could also be produced in any other process known to a person skilled in the art.

The length, width and number of the microstrip lines are design parameters which may vary depending on frequency, material, substrate thickness and desired filter properties. The length and width of the lines and distance between any pair of lines may also vary in a single component. Typical applications of this filter will be at signal frequencies in the range of 200 MHz-2 GHz. In principle, the inventive concept may find applications also outside this frequency range, but the said frequency range is particularly attractive. At a frequency of, say, 1.3 GHz the line width would typically be in the range 1-2 mm and the line length would typically be a few mm. The number of lines may vary depending on the filtering requirements, but devices with 2-6 lines sections are preferable. Preferably, the lines are of equal length, in order to simplify implementation (fabrication process). Further, if the lines are of equal length, the most efficient use of the substrate area is possible and the use of a single acoustic device supporting all acoustic resonators is enabled as connections points lie substantially along a single line.

Figure 2:
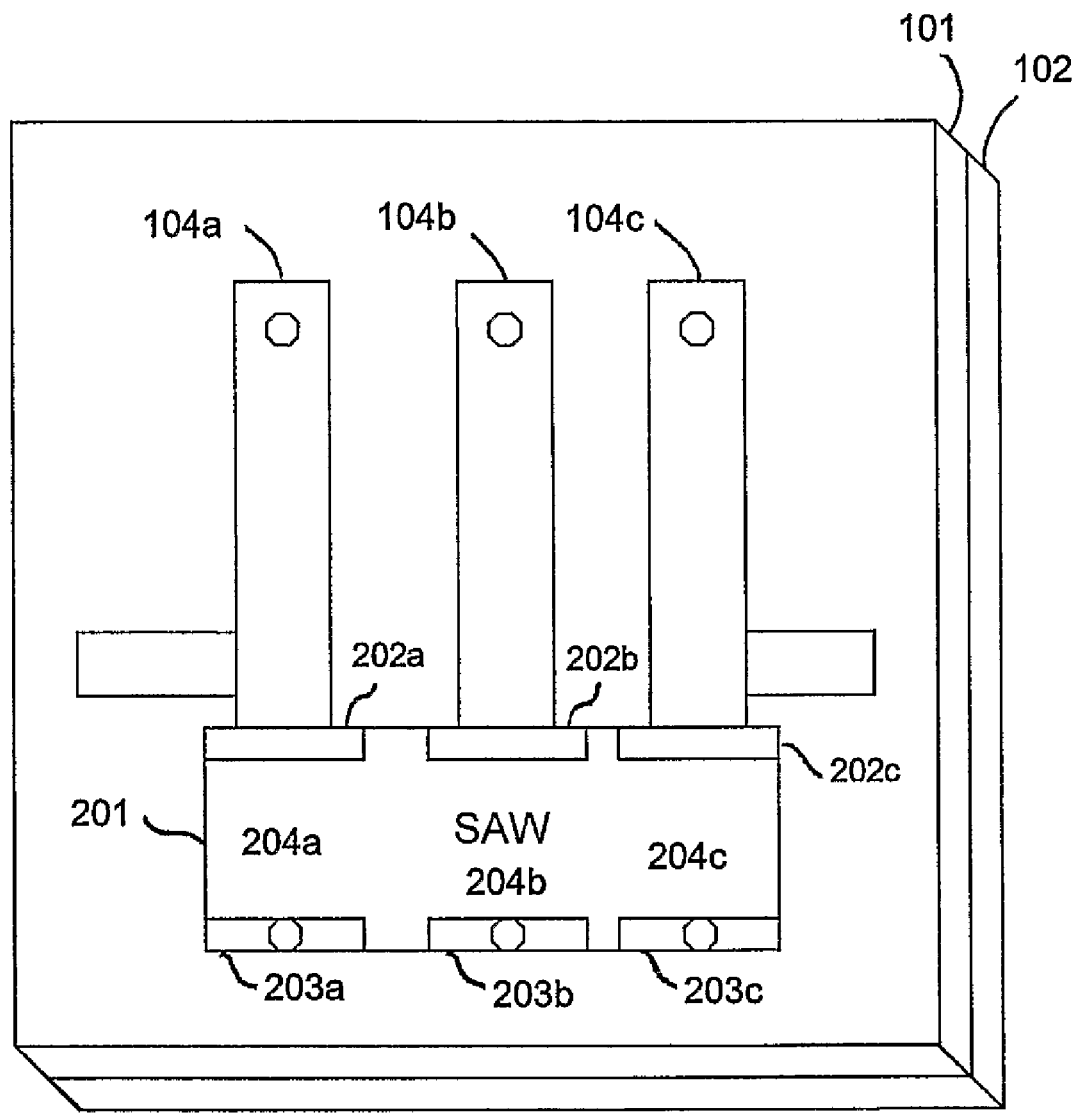
FIG. 2 illustrates an alternative embodiment of the filter according to the invention.

A SAW resonator typically comprises an interdigital transducer with acoustic reflectors on both sides of the said transducer. The transducer typically comprises a number of Fingers connected to the electrodes 202a-c, 203a-c With reference to FIG. 2 there is illustrated an alternative embodiment of the filter according to the invention wherein three SAW-resonator devices are integrated into one component 201, using for example a single common piezoelectric substrate having three sets of resonator electrodes 202a-c, 203a-c defining separate resonator areas or volumes 204a-c in the resonator element.

In the case of using SAW resonators, these could be made from a piezoelectric crystal, in particular quartz for narrowband notch applications and $LiNbO_3$ for band rejection applications. For application in these inventions, it is of importance to be able to vary and choose design parameters for the SAW-device according to the application and desired filter functions. Hence, the SAW-devices will typically not be off-the-shelf devices, but rather produced in a custom-made manner for each application, system.

The SAW device is typically produced from a separate substrate. The separate SAW device is then mounted onto the substrate with the combline structure, or alternatively, the SAW device and the combline structure could be mounted separately in a suitable housing structure, e.g. at the bottom of a housing as illustrated on FIG. 6, showing a top view inside an opened housing.

The SAW-device may in some versions of the invention be mounted in a separate closed housing where connections external to the housing provide electrical connections to the combline filter. In other versions of the filter according to the invention for application in the high frequency end of the spectrum, the SAW-device and the combline structure is mounted on a common substrate or mounting surface, and a common housing is provided for encapsulation and protection of the combined filter.

The combline structure may be attached to a mounting surface using electrically conductive adhesive in order to provide a good ground plane. The acoustic resonator device, on the other hand, can be attached using any type of adhesive, as it is not important to connect this device to ground.

It is also possible to integrate the combline structure onto the same piezoelectric substrate where the SAW resonators are located by metallization of the piezoelectric substrate. Thus, a single chip filter is provided.

In operation the combline structure provides a radio filter which selects the input signal of a given frequency band which will be delivered to the output terminal. The given frequency band will be given by the length and space between the microstrip lines and the capacitance of the acoustic resonator device outside the resonance frequency of the acoustic resonator. Near or within the pass band of the device there will be a frequency notch at the resonance frequency of the acoustic resonator device, due to the short/open circuit nature of the acoustic resonator device at the resonance band.

On the background of conventional thinking a person skilled in the art would not normally consider a combline filter to be particularly attractive in a filter configuration as described in this invention because the flanks of the pass band of such a filter are not sufficiently steep to provide good pass band properties and sufficient attenuation outside the pass band. However, the present inventors have realized the characteristics of the combline structure may be accepted in a filter structure according to this invention, because the acoustic resonators provide notches in the frequency response which attenuate particular undesirable frequencies, such as the carrier frequency or undesirable mixing products.

In other words, when using acoustic resonators the demands on the properties of the pass band may be relaxed to an extent so as to allow the use of a combline structure in a combined filter structure according to the invention. By opening for the use of a combline filter in this way, improved high frequency devices may be obtained, because a combline structure provide improved reproducibility/yield and predictable characteristics at higher frequencies, thereby reducing the need for filter tuning.

By choosing characteristics of the acoustic resonator device, the notch band 315 could be designed to lie on the low frequency slope of the pass band 316 of the filter as illustrated in FIG. 3A. Alternatively, the characteristics of the device could be chosen such that the notch band lies below or above the frequency region of the pass band of the filter. FIG. 3B illustrates an example where the notch band 315 of the filter is in the middle of the passband 316. Such a characteristic is useful in homodyne up-conversion, where the local oscillator (LO) signal ends up in the middle of the signal band, and has to be removed.

FIG. 4 illustrate a typical prior art solution for filtering out a single sideband 405 resulting from the up conversion of a signal band around an intermediate (IF) frequency 403 to a significantly higher frequency by mixing the IF-signal with a local (LO) oscillator signal in mixing device 401. A resulting mixed signal typically comprises a lower sideband 406 and a higher sideband 405 and a remaining carrier component 407. To save bandwidth while preserving the information content, only one of the sidebands is filtered out, in this example the higher sideband 405, using a band pass filter ($F_{trad}$) having a pass band as indicated by the numeral 408.

Using a filter according to this invention the corresponding process is illustrated in FIG. 5, where the traditional filter ($F_{trad}$) has been replaced by a the filter according to this invention ($F_{inv}$). As in FIG. 4 an upper inset on the Figure illustrates the mixing 501 of an intermediate (IF) frequency band 503 with a local oscillator (LO) to up-convert a signal at the intermediate frequency band to a significantly higher frequency. The result is a carrier signal 507 at the frequency of the local oscillator (LO) and a lower sideband 506 and a higher sideband 505. This resulting mixed signal is applied to a filter ($F_{inv}$) according to the invention having the passband characteristic referred to by the numeral 508. On FIG. 5 the remaining carrier signal 507 is shown to lie near the edge of the maximum level of the passband of the filter, i.e. well up on one of the flanks of the passband of the filter. However, the remaining carrier will be significantly attenuated by the notch band 509, as the notch band may be designed to be centered or have its center near the local oscillator (LO) carrier frequency.

On FIG. 6 there is illustrated one possible mounting arrangement of this filter in single housing 601. The acoustic resonator element 602 is mounted separated from, but electrically connected to, the combline element 603.

A significant advantage of the filter according to the invention is that a band pass filter having a notch band can be realized without using discrete inductors. This yields a much more reproducible design, particularly in the high frequency end of the frequency range considered. At very high frequencies discrete inductors of the desired characteristics is very difficult to realize in a reproducible manner. The use of a combline structure, however, offers a stable and reproducible solution.

Another advantage of the present invention is that the combline structure replaces the discrete inductors of previous solutions. The use of a combline structure reduces the space required in comparison to solutions with discrete passive elements.

As already mentioned, the use of a combline filter element provides a way of designing high quality band pass filters for very high signal frequencies used in a number of applications, for example space communication applications.

Typical examples of applications of the herein described filter are thus in radio transmitters used to up-convert a signal from an input baseband/IF frequency to an RF output frequency. Such radio transmitters are used in applications such as communication and navigation systems.

The invention claimed is:

1. A radio filter having a band pass filter for passing a desired band of signal frequencies and a stop filter for reducing the passing of a band of undesired signal frequencies, said radio filter comprising:
   an input terminal;
   an output terminal;
   a filter having a multiple of coupled transmission lines arranged between said input and output terminal, which filters input signals through said input terminal to pass signals of a given frequency band;
   a ground connected to said transmission lines at first ends of said multiple of transmission lines; and
   an acoustic impedance element is connected between said ground and second ends of said multiple transmission lines for providing a stopband filter function of the input signals, and whereby the input signal after bandpass filtering and stopband filtering is provided at said output terminal.

2. The radio filter according to claim 1, wherein the input terminal, the output terminal and the filter are part of a filter layer.

3. The radio filter according to claim 1, wherein said ground is a ground layer.

4. The radio filter according to claim 1, wherein the filter comprises coupled transmission lines in a combline structure.

5. The radio filter according to claim 4, wherein said coupled transmission lines comprise coupled microstrip lines.

6. The radio filter according to claim 1, wherein said acoustic impedance element comprises a surface acoustic wave (SAW) impedance element, the SAW-element being connected between said ground and one of said second ends of said multiple transmission lines.

7. The radio filter according to claim 1, wherein said acoustic impedance element comprises a film bulk acoustic resonator (FBAR) element, the FBAR-element being connected between said ground and one of said second ends of said multiple transmission lines.

8. The radio filter according to claim 1, wherein said acoustic impedance element comprises several physically separated surface acoustic wave (SAW) devices.

9. The radio filter according to claim 1, wherein said acoustic impedance element comprises a single piezoelectric crystal in which separate regions and separate transducers provide several surface acoustic wave (SAW) devices in a single crystal based integrated component.

10. The radio filter according to claim 1, wherein said transmission lines are microstrip lines.

11. The radio filter according to claim 1, wherein the acoustic impedance element and the transmission lines are located on a single piezoelectric substrate.

* * * * *